United States Patent [19]

Arai

[11] 4,031,475
[45] June 21, 1977

[54] ELECTRONIC CHANNEL SELECTING APPARATUS

[75] Inventor: Takeshi Arai, Higashiosaka, Japan

[73] Assignee: Sanyo Electric Co., Ltd., Japan

[22] Filed: Apr. 5, 1976

[21] Appl. No.: 673,941

[30] Foreign Application Priority Data

Apr. 3, 1975 Japan ............................ 50-41029

[52] U.S. Cl. ............................ 325/455; 325/459; 325/465; 334/15
[51] Int. Cl.² ........................................ H04B 1/26
[58] Field of Search .......... 325/464, 465, 468, 452, 325/453, 455, 459; 334/11, 14, 15; 340/147 C, 147 F, 171 A

[56] References Cited

UNITED STATES PATENTS

| 3,740,651 | 6/1973 | Mons | 325/464 |
| 3,889,195 | 6/1975 | Elshuber | 334/15 |
| 3,895,302 | 7/1975 | Makino | 334/15 |
| 3,903,433 | 9/1975 | Leuschner | 334/15 |
| 3,973,207 | 8/1976 | Sugizaki | 325/464 |

Primary Examiner—Benedict V. Safourek
Assistant Examiner—Marc E. Bookbinder
Attorney, Agent, or Firm—Armstrong, Nikaido & Marmelstein

[57] ABSTRACT

An electronic channel selecting apparatus, comprising; a touch switch responsive to a touch of a finger thereto for selectively providing a plurality of individual channel selecting signals; a tuner including a voltage controlled variable capacitance diode; a plurality of tuning control voltage generators, each responsive to the corresponding one of said individual channel selecting signals for providing a different tuning control voltage to the said variable capacitance diode for selecting the corresponding one of a plurality of broadcasting channels, each of said tuning control voltage generators comprising a gate responsive to a gating signal for passing therethrough the corresponding individual channel selecting signal, a storing circuit responsive to the corresponding individual channel selecting signal, as gated by the said gate, for assuming an active state and responsive to a disabling signal for assuming an inactive state, a potentiometer for providing a predetermined voltage for selecting the corresponding one of said plurality of broadcasting channels when it is applied to the said variable capacitance diode, and a switch responsive to the active state output from the storing circuit for passing therethrough the said predetermined voltage as the said tuning control voltage to the said variable capacitance diode of the tuner; said apparatus further comprising a control responsive to the active state output from any one of said plurality of storing circuits and an individual channel selecting signal for providing said gating and disabling signals to said gates and storing circuits, respectively, whereby a state of receiving the corresponding one of said plurality of broadcasting channels is established.

16 Claims, 9 Drawing Figures

ELECTRONIC CHANNEL SELECTING APPARATUS

BACKGROUND OF THE INVENTION

1. Field of the Invention

The present invention relates to an electronic channel selecting apparatus. More specifically, the present invention relates to an electronic channel selecting apparatus in which any one of a plurality of channel selecting circuits is selectively brought in an active state upon application of an individual channel selection signal to the corresponding channel selecting circuit for providing a preset tuning control voltage for the corresponding channel to a tuner employing a voltage controlled variable reactance device as a tuning element.

2. Description of the Prior Art

In reception of the television broadcast, it is necessitated to select a desired channel out of several television broadcast channels. One of the typical channel selectors so far employed in selection of television channels is a rotary switch. However, a rotary switch usually makes a circuit through a mechanical touch between paired contacts performed by a manual rotating operation. For this reason a rotary switch always suffers from a poor electrical contact between the paired contacts caused by deterioration of the contact surfaces, a tiresome manual operation and a noise caused by rotating operation thereof. Another typical channel selector suitable for selection of television channels is a multi-circuit push button switch. Again, however, the push button switch involves the same shortcoming of a poor electrical contact for the same reason as that of the rotary switch.

Recently a television channel selecting apparatus for selecting television channels employing a voltage controlled variable capacitor has been proposed and widely used. Such a voltage controlled variable capacitor uses a capacitance formed at a barrier portion of a diode, variable as a function of a reverse voltage applied thereacross, and is also known as a variable capacitance diode. In such a television channel selecting apparatus, it is necessary to provide a tuning control voltage generating circuit in which any one of a plurality of storing circuits is selectively brought in an active state or a signal storing state upon individual manual selection for providing a corresponding tuning control voltage to apply the same to a voltage controlled variable capacitor employed as a tuning element of the television channel selecting apparatus. In view of implementing the channel selecting circuits by means of solid components such as voltage controlled variable capacitor, it is also preferred to implement a plurality of tuning control voltage generating circuits by means of solid state components.

A television channel selecting apparatus of a remote control type has also been proposed and in practical use. Such an apparatus is supplied with a common selection signal via a common input circuit in lieu of individual selection signals to be applied individually to the corresponding signal storing circuits. It is again preferred to provide a channel selecting apparatus in which any one of a plurality of signal storing circuits is selectively brought in an active state upon application of a common selection signal via a common input circuit as well as of an individual selection signal to the corresponding signal storing circuit for providing a corresponding tuning control voltage therefrom.

Another type of television channel selecting apparatus employing a voltage controlled variable capacitor is structured such that the bands of the television channels are switched by means of solid state components and in response to a band switching signal. More specifically, a typical television channel selecting apparatus employing a voltage controlled variable capacitor as a tuning element is adapted to be capable of receiving a UHF band as well as a VHF band which is constituted of a low VHF band and a high VHF band according to the Japanese television broadcasting standard, as well known to those skilled in the art. Thus, such a television channel selecting apparatus should be capable of selectively switching these broadcasting bands, i.e. a VHF low band and a VHF high band, and a UHF band in response to a band selecting signal, preferably with solid state components.

In summary, a television channel selecting apparatus employing a voltage controlled variable capacitor as a tuning element is preferably capable of performing various functions, such as providing a band switching signal, providing a channel selection display signal, selecting channels in response to a remote control signal, preventing malfunction of an automatic frequency tuning at the time of channel selecting, initial setting of a specified channel at the time of turning on of a power supply of the television receiver, and the like, in addition to supplying a preset tuning control voltage for the corresponding channel to a voltage controlled variable capacitance diode. These requirements make the circuit configuration of the apparatus complicated and necessitate optimized interrelationship of the circuit portions in the apparatus for performing these functions. On the other hand, if the apparatus is to be implemented employing an integrated circuit, it is imperative that these circuit portions be implemented with economy and for better performance.

SUMMARY OF THE INVENTION

Briefly stated, the present invention comprises an electronic channel selecting apparatus, comprising: means for selectively providing a plurality of individual channel selecting signals for selecting the corresponding one of a plurality of broadcasting channels; tuning means comprising tuning circuit means including a voltage controlled variable reactance device the reactance of which is variable as a function of a tuning control voltage applied thereto, said variable reactance device determining a tuning frequency of said tuning means; a plurality of tuning control voltage providing means, each responsive to the corresponding one of said individual channel selecting signals for providing a different tuning control voltage to said voltage controlled variable reactance device of said tuning means for selecting the corresponding one of said plurality of broadcasting channels; each said tuning control voltage providing means comprising gate means responsive to a gating signal for allowing the corresponding individual channel selecting signal to pass therethrough, store means responsive to said corresponding individual channel selecting signal, as gated by said gate means, for assuming an active state and responsive to a disabling signal for assuming an inactive state, preset voltage providing means for providing a predetermined voltage for selecting the corresponding one of said plurality of broadcasting channels when said predetermined voltage is applied to said variable reactance device, and switching means responsive to the active state output from said store means for allowing said predetermined voltage to pass therethrough to said voltage controlled variable reactance device of said tuning means; said apparatus further comprising means responsive to the active state output from any one of said plurality of store means and an individual channel selecting signal for providing said gating and disabling signals to said gate means and store means, respectively, whereby a state of receiving the corresponding one of said plurality of broadcasting channels is established. The said gating and disabling signal providing means may comprise means for evaluating the sum of the output currents from said plurality of store means and means responsive to said sum of the output currents for determining at least two said store means being in an active state for providing said gating and disabling signals.

Preferably the said tuning means is a type being capable of being switched to a plurality of channel bands, such as a VHF low band and a VHF high band and a UHF band, and the said apparatus may further comprise means responsive to the outputs from said store means of said plurality of tuning control voltage providing means for switching to the corresponding band to which the corresponding receiving channel pertains. The said apparatus may further comprise means responsive to the outputs from the store means of said plurality of tuning control voltage means for displaying the corresponding receiving channel.

In another embodiment of the present invention, the said individual channel selecting signal providing means comprises interconnection means for implementing interconnection of said plurality of tuning control voltage providing means in a ring counter fashion and means for stepping said active state of said store means through said interconnection means. Such stepping means preferably comprises means for generating a remote control signal comprising a train of pulses for stepping said active state of said store means through said connection means.

Therefore, a principal object of the present invention is to provide an improvement in an electronic channel selecting apparatus in which any one of a plurality of channel selecting circuits is selectively brought in an active state upon application of an individual channel selection signal to the corresponding channel selecting circuit for providing a preset tuning control voltage for the corresponding channel to a tuner employing a voltage controlled variable reactance device as a tuning element.

Another object of the present invention is to provide an improved electronic channel selecting apparatus employing a voltage controlled variable reactance device as a tuning element, in which means is provided for making the channel selecting operation of the apparatus immune to interferences such as noise, whereby the operation of the apparatus in channel selection is stabilized.

A further object of the present invention is to provide an improved electronic channel selecting apparatus employing a voltage controlled variable reactance device as a tuning element, in which various functions, such as providing a band switching signal, providing a channel selection display signal, selecting channels in response to a remote control signal, preventing malfunction of an automatic frequency tuning at a time of channel selecting, initial setting of a specified channel at the time of turning on of a power supply of a receiver, and the like can be performed, in addition to supplying a preset tuning control voltage for the corresponding channel to a voltage controlled variable reactance diode, with economy.

These objects and other objects, features, advantages and aspects of the present invention will be better understood when taken in conjunction with the following detailed description of the preferred embodiments made with reference to the accompanying drawings.

DESCRIPTION OF THE PREFERRED EMBODIMENTS

Figure 1:
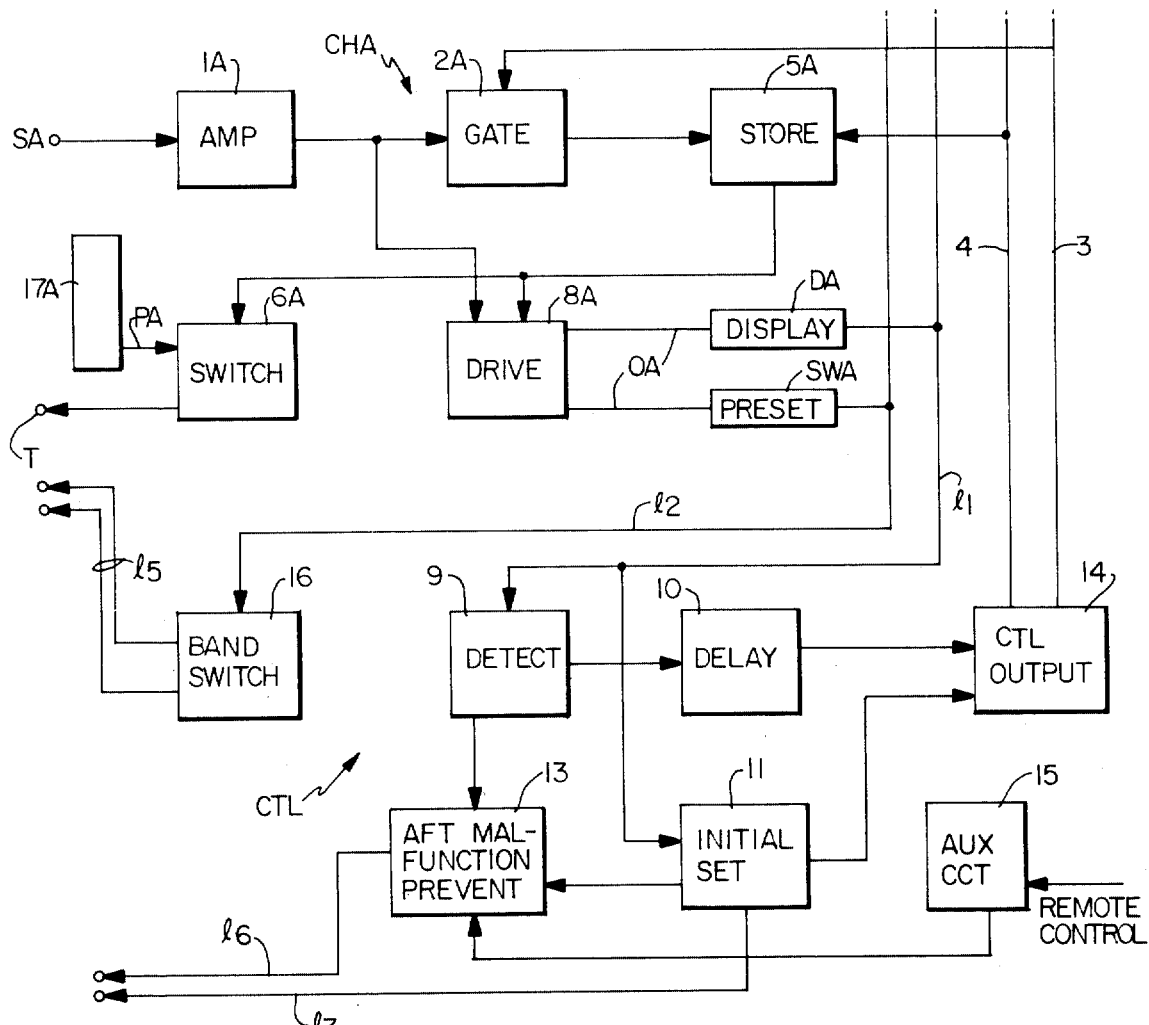
FIG. 1 shows a block diagram of only the individual tuning control voltage generator CHA and the control CTL in FIG. 1A.
Figure 1A:
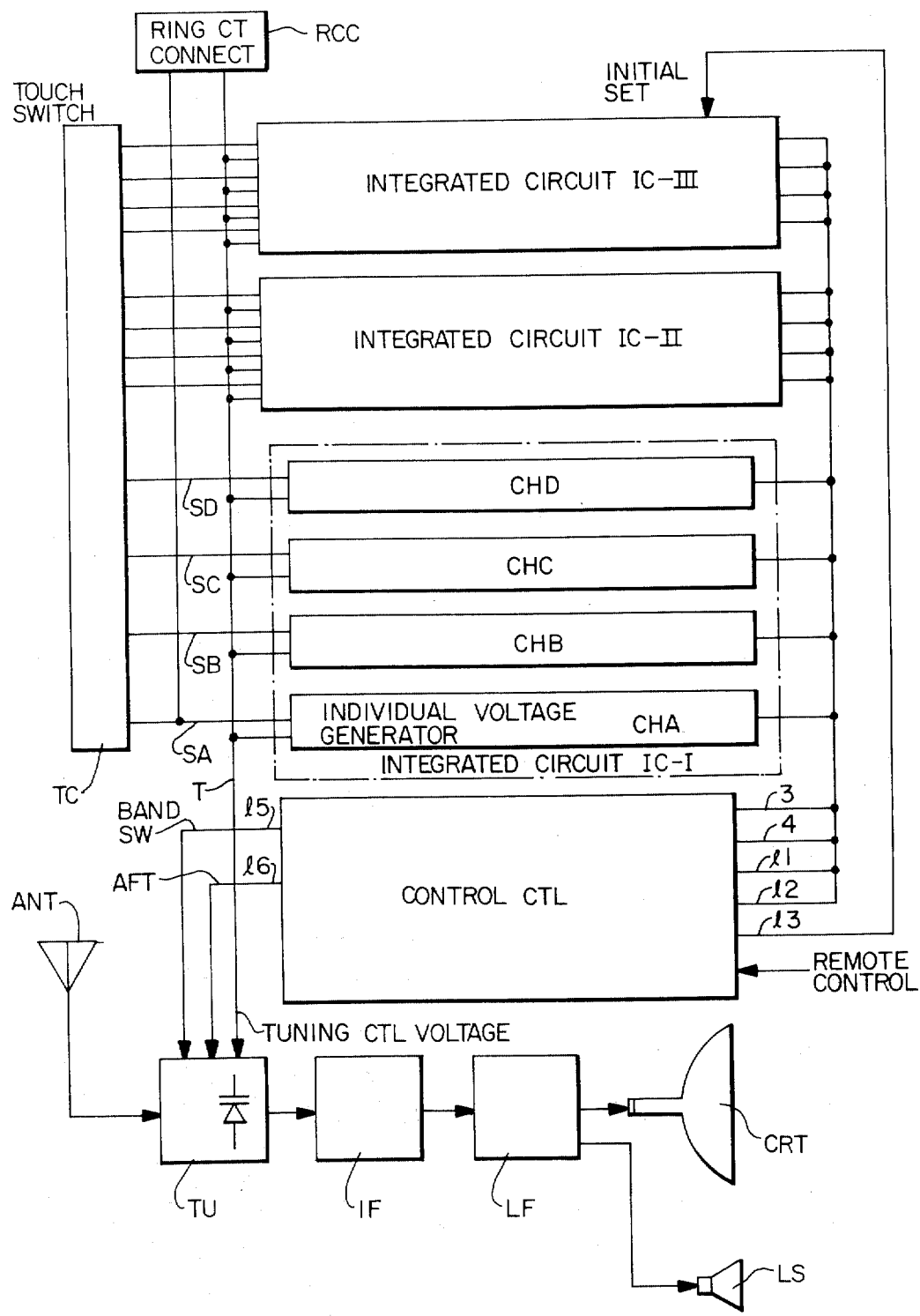
FIG. 1A is a block diagram of a television receiver employing an electronic channel selecting apparatus in accordance with the present invention.

FIG. 1A is a block diagram of a television receiver employing an electronic channel selecting apparatus in accordance with the present invention. The televisin receiver is shown comprising an antenna ANT for receiving the broadcast television wave transmitted using a VHF and UHF waves, a tuner TU for selecting the television wave of a desired television broadcasting channel and converting the frequency of the television wave of the selected channel into a predetermined intermediate frequency, an intermediate frequency amplifier IF for amplifying the said converted intermediate frequency output from the tuner TU, a low frequency amplifier LF for detecting the output from the intermediate frequency amplifier IF and amplifying the detected signal for providing a video and sound signals and further providing various signals necessary for driving a cathode ray tube, such as vertical and horizontal deflection signals, a high voltage output and the like, a cathode ray tube CRT responsive to the said video signal, vertical and horizontal reflection signals, high voltage output and the like for displaying the original picture transmitted through the channel selected by the tuner, and a loud speaker LS responsive to the said sound signal for providing an audible output of the original sound transmitted through the selected channel. The tuner TU usually comprises a high frequency amplifier, a mixer and a local oscillator, as well known to those skilled in the art. Although the present invention is not limited thereto, the tuner TU of the embodiment to be dipicted herein comprises VHF and UHF tuners. Each of the VHF and UHF tuners comprises a voltage controlled variable reactance device in the respective high frequency amplifier and local oscillator by way of a tuning element of a tuning circuit included in the respective high frequency amplifier and local oscillator, the value of reactance of the said voltage controlled variable reactance device being variable as a function of a control voltage applied thereto. A typical voltage controlled variable reactance device now commercially available is a voltage controlled variable capacitance device, which utilizes a capacitance across the junction of a diode variable as a function of a control voltage applied thereacross. Such a voltage controlled variable capacitance device is simply referred to as a voltage controlled variable capacitance diode or a voltage controlled variable capacitor in the present specification, but has been commercially called as a varicap or varactor. The voltage controlled variable capacitance diodes to be included in the tuner TU have been symbolized in the figure as a combination of the symbol of a capacitor and the symbol of a diode, as seen within the block TU in FIG. 1A.

As well known to those skilled in the art, the VHF television channels are divided into a low band covering the television channels of a lower VHF frequencies and a high band covering the television channels of higher VHF frequencies, with a frequency gap therebetween. As described previously, the tuner TU also comprises a UHF tuner for covering a UHF television channel band. Thus it is appreciated that the tuner TU should be capable of being switched to any one of television channel bands, i.e. a VHF low band, a VHF high band, or a UHF band. Selection of these television channel bands is effected in the tuner TU as a function of a band switching output obtainable from a line l5. Selection of the UHF band is usually effected by energizing both the UHF and VHF tuners and by connecting them in a cascade fashion, in which case usually only the local oscillator of the VHF tuner is disabled, thereby to eliminate any unfavorable interference. On the other hand, selection of the VHF tuner is effected by the deenergizing the UHF tuner and energizing only the VHF tuner, including the local oscillator thereof.

Selection of a low or high VHF band is carried out by shunting a portion of a coil connected in parallel with a voltage control variable capacitor to form a tuning circuit included in each of the high frequency amplifier and the local oscillator of the VHF tuner, as a function of a band switch signal, thereby to change the value of the inductance of the said coil and thus the tuning frequency of the said tuning circuit. More specifically, the coil constituting a tuning circuit together with a voltage controlled variable capacitor of each of the high frequency amplifier and the local oscillator of the VHF tuner is provided with a center tap, which is supplied through a switching diode with a two-level signal, whereby the diode is rendered conductive by one level of the signal to shunt a portion of the coil and the diode is rendered non-conductive by the other level of the signal to keep the portion of the coil unshunted, with the result that the VHF tuner is switched to either low or high band.

Selection of channels in the tuner TU is effected by selectively applying one of a plurality of different control voltages to the variable capacitance diodes in the tuner TU. Such a selective tuning control voltage is applied to the tuner TU through a line T. It is appreciated that each of the said plurality of predetermined different tuning control voltages is selected to be a value which causes the value of capacitance across the respective diode thereby to establish a desired tuning frequency in the tuning circuit implemented by a variable capacitance diode shunted by the coil and thus to achieve tuning to the frequency of a desired television broadcasting channel.

Again, as well known to those skilled in the art, typical television channel selector usually employs an automatic frequency tuning control for the purpose of achieving fine tuning control in an automatic fashion. Thus, the tuner TU also employs such an automatic frequency tuning control, so as to be controllable as a function of an automatic frequency tuning control signal AFT obtainable from a line l6.

Now that the background of a television receiver in which the present invention can be advantageously employed was described in the foregoing, a basic concept of the present invention will be described with further reference to FIG. 1A. The present invention is directed to an improvement in an electronic circuit responsive to an individual channel selecting signal for providing a corresponding tuning control voltage and various control signals such as a band switch control signal, an automatic frequency tuning control signal and the like. Such an improved electronic circuit comprises three chips of integrated circuits IC-I, IC-II and IC-III for individually generating the said plurality of different predetermined tuning control voltages and a control circuit CTL preferably implemented by an integrated circuit and operatively connected to the said integrated circuits IC-I, IC-II and IC-III. Each of the integrated circuits IC-I, IC-II and IC-III comprises four individual tuning control voltage generators. In FIG. 1A, only the integrated circuit IC-I is shown comprising such four individual tuning control voltage generators CHA, CHB, CHC and CHD, while the other two integrated circuits IC-II and IC-III are shown with these details not shown for simplicity of illustration. Thus, it is appreciated that the electronic circuit shown in FIG. 1A comprises twelve individual tuning control voltage generators in all, operatively connected with the control CTL. Such interconnection between the individual tuning control voltage generators and the control CTL comprises lines 3, 4, l1, l2, for each of the individual tuning control voltage generators, although such interconnection is shown generally by way of a single line at the side of each of the individual tuning control voltage generators.

Each of the individual tuning control voltage generators is connected to receive individually an individual channel selecting signal obtainable from a well known touch switch TC. Such individual channel selecting signals are applied to the individual tuning control voltage generators CHA, CHB, CHC and CHD through lines SA, SB, SC and SD, respectively, although such denotation of the lines for transmission of individual channel selecting signals to other integrated circuits IC-II and IC-III are omitted for simplicity of illustration.

For the purpose of remote control of the inventive channel selecting apparatus by a remote control signal received at a common channel selecting signal terminal, the embodiment shown further comprises an interconnection for implementing a ring counter connection RCC of 12 individual tuning control voltage generators, which comprises inter-stage connection from an output for withdrawing a tuning control voltage from one voltage generator to an input for receiving an individual channel selecting signal of the next adjacent voltage generator. The ring counter connection is adapted to be responsive to a remote control signal comprising a train of pulses the number of which corresponds to the desired stepping operation in the ring counter connection RCC. The remote control signal, as described above, is adapted to be once received by the control CTL to generate signals at lines 3 and 4 to the ring counter connection RCC.

The embodiment shown further comprises a scheme responsive to turning on of a power supply to the television receiver for forcibly selecting a predetermined one of the individual tuning control voltage generators by way of an initial setting condition. Such an initial setting is effected by providing an initial setting singal to a predetermined one of the individual tuning control voltage generators through a line l3.

Briefly stated, each of the individual tuning control voltage generators comprises a gate for passing the corresponding individual channel selecting signal as a function of a gating signal, a storing circuit to be brought in an active state as a function of an output from the gate and to be brought in an inactive state as a function of a disabling signal, a preset voltage source such as a potentiometer for providing the corresponding tuning control voltage, and a switch circuit responsive to an active state of the said storing circuits for passing therethrough the preset tuning control voltage from the said preset voltage source. On the other hand, control CTL comprises a circuit responsive to an active state of the storing circuit in any one of twelve individual tuning control voltage generators and a new individual channel selecting signal to be received at any one of the twelve individual tuning control voltage generators for providing the said gating signal to the gate of the respective voltage generators and the said disabling signal to the storing circuits of the respective voltage generators. In operation, if and when an individual channel selecting signal is received at any one of the voltage generators, the corresponding voltage generator is brought in an active state due to the fact that the storing circuit therein is brought in an active state and accordingly a tuning control voltage predetermined therein is obtainable therefrom and is applied to the tuner TU, whereby a corresponding television channel is selected as a result of tuning of the tuning circuits in the tuner to the frequency of the desired television channel. If and when the remote control signal comprising a predetermined number of pulses is received to the control CTL, the said gating and disabling signals are generated similarly at the lines 3 and 4 and the ring counter connection RCC is driven by these gating and disabling signals. Therefore, the active state in the voltage generator is shifted sequentially to the next adjacent voltage generator, with the result that the corresponding voltage generator is brought to an active state and thus the corresponding television channel is similarly selected.

FIG. 1 shows a block diagram of only the individual tuning control voltage generator CHA and the control CTL in FIG. 1A, while the other portions in FIG. 1A are omitted for simplicity of illustration. It is pointed out that the circuit configuration of the individual tuning control voltage generator CHA is substantially the same as those in other individual tuning control voltage generators, the major difference being that the preset value of the preset voltage source for the tuning control volage and a scheme for generating the band switch are adapted to be uniquely determined for the respective voltage generator. Therefore, the reference characters allotted to the blocks in the voltage generator CHA have been selected to comprise the subscript of the same character "A" after that in the reference characters CHA and SA in FIG. 1A. It is pointed out that the same applies to the other individual voltage generators CHB, CHC and CHD in the subsequent description.

Referring to the FIG. 1, the individual voltage generator CHA comprises an amplifier 1A responsive to an individual channel selecting signal obtainable from the touch switch TC as a touch input signal and applied to the terminal SA for driving the subsequent stage, a gate 2A adapted to be opened as a function of a gating signal obtainable through the line 3 from the control CTL as to be described subsequently for allowing the individual channel selecting signal to be passed therethrough, a storing circuit 5A to be brought in an active state or an enabled state responsive to the individual channel selecting signal allowed to pass through the gate 2A and to be brought in an inactive or disabled state as a function of a disabling signal obtainable through the line 4 from the control CTL, as to be described subsequently, a preset voltage source 17A such as a potentiometer for providing a predetermined tuning control voltage, a switch circuit 6A responsive to the active state output from the storing circuit 5A for withdrawing at the terminal T the preset tuning control voltage therethrough from the preset voltage source 17A and a drive means 8A coupled to the outputs from the said amplifier 1A and the storing circuit 5A for driving a channel display means TA and for driving through lines l1 and l2 various circuits in the control CTL.

The control CTL comprises a detecting circuit 9, a delay 10, an initial setting circuit 11, a circuit 13 for preventing malfunction of an automatic frequency tuning control, a control output 14, and auxiliary circuit 15 and a band switch circuit 16. The detecting circuit 9 is so structured that it provides an output if and when an individual channel selecting signal is received by any one of the tuning control voltage generators while the storing circuit of any one of the voltage generators is in the active state. The delay circuit 10 serves to delay the output from the detecting circuit 9 and apply it to the control output 14. The control output 14 is responsive to the output from the delay circuit 10 to provide the above described gating signal at the line 3 and the disabling signal at the line 4. If and when the disabling signal is obtained through the line 4 from the control output 14, the storing circuit in the individual voltage generators not receiving any individual channel selecting signal are all brought into an inactive or disabled state, while only the storing circuit which has been supplied with the individual channel selecting signal through the gate is brought into an active or enabled state. Accordingly, the storing circuit which has been previously in an active state are also brought in an inactive state because of the absence of the individual channel selecting signal through the gate, while the storing circuit of the individual voltage generator receiving an individual channel selecting signal is brought in an active state, with the result that channel switching is effected.

Since no output is obtained from the detecting circuit 9 during the normal channel reception state of the channel selecting apparatus, the control output 14 is not enabled and thus neither the storing circuit is brought in an inactive state nor the gate 2A is supplied with a gating signal thereby to keep the gate 2A closed. Accordingly, a possible incoming undesirable pulse to the individual voltage generator and thus to the gate is prevented from bringing the storing circuit into an active state. Thus it is appreciated that the gate is inserted for the purpose of preventing malfunction of the storing circuit by a possible incoming undesirable pulse. This is particularly important in such an environment in which such an undesirable pulse is liable to occur which is caused by spark in a cathod ray tube such as in a television receiver, a rush current at the time of turning on of the power supply to the receiver or the like. Since the embodiment shown has been adapted to be operated by a remote control, the terminal SA need be supplied with a channel selecting signal grenerated by means of the remote control. Such an individual channel selecting signal by means of the remote control may be directly applied to the respective terminal by applying such a signal individually to the respective terminal in the remote control manner rather than through a direct touch to the touch switch. In the embodiment shown, however, the apparatus is adapted to receive a remote control signal comprising a train of pulses the number of which is associated with channel selection and the ring counter connection RCC is provided such that the active state in one of the storing circuits in the individual voltage generators is shifted in sequence to the next adjacent voltage generator as a function of the said remote control pulses. Such remote control pulses is adapted to be received by the auxiliary circuit 15 to achieve a channel selecting operation as mentioned above. More detailed structure and operation of the blocks 13, 11 and 15 as well as these blocks 16, 9, 10 and 14 will be described subsequently.

Figure 2A:
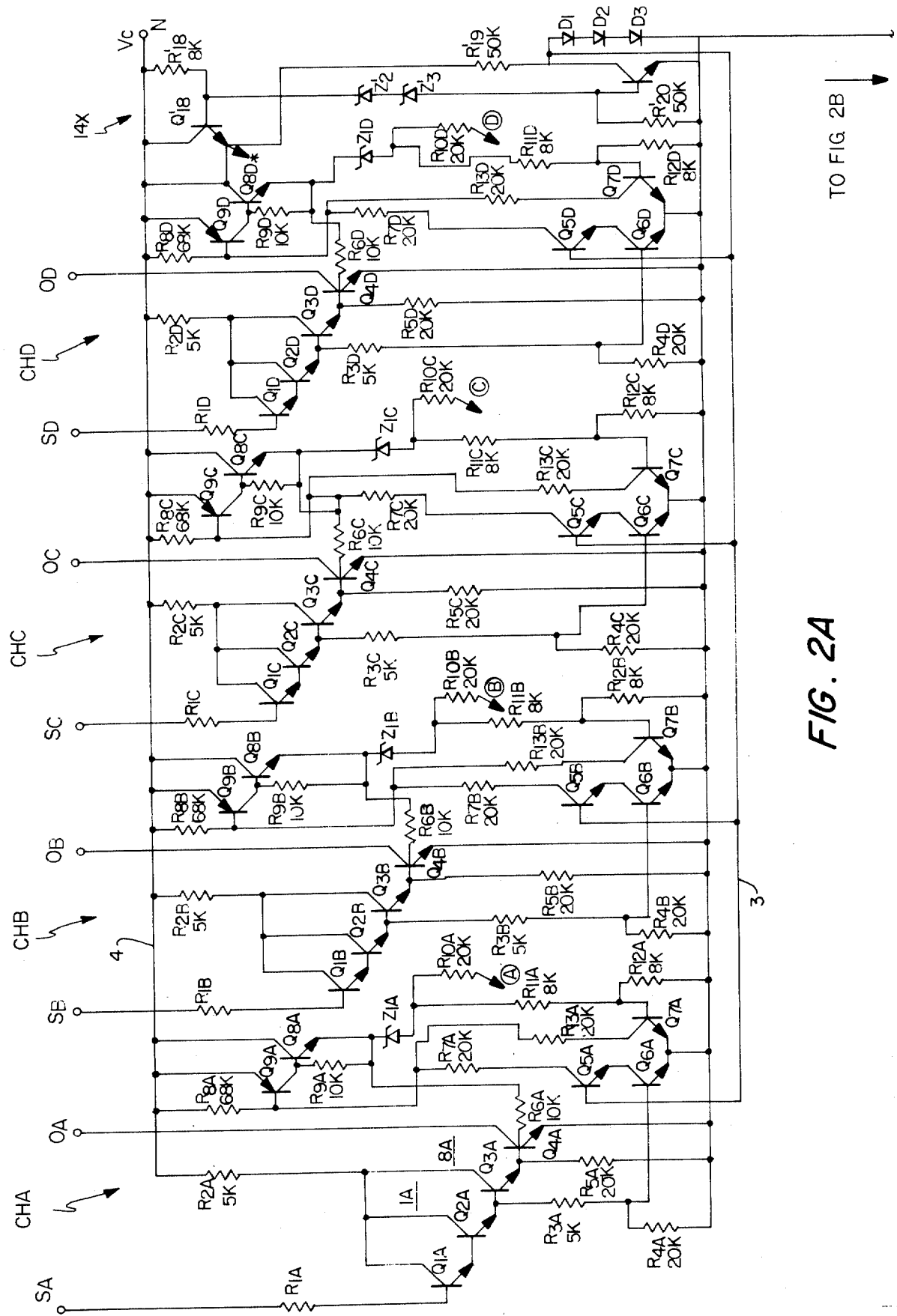
FIGS. 2A and 2B show a schematic diagram of the individual tuning control voltage generators CHA, CHB, CHC and CHD and a portion 14X of the control output 14 of the control CTL.
Figure 2B:
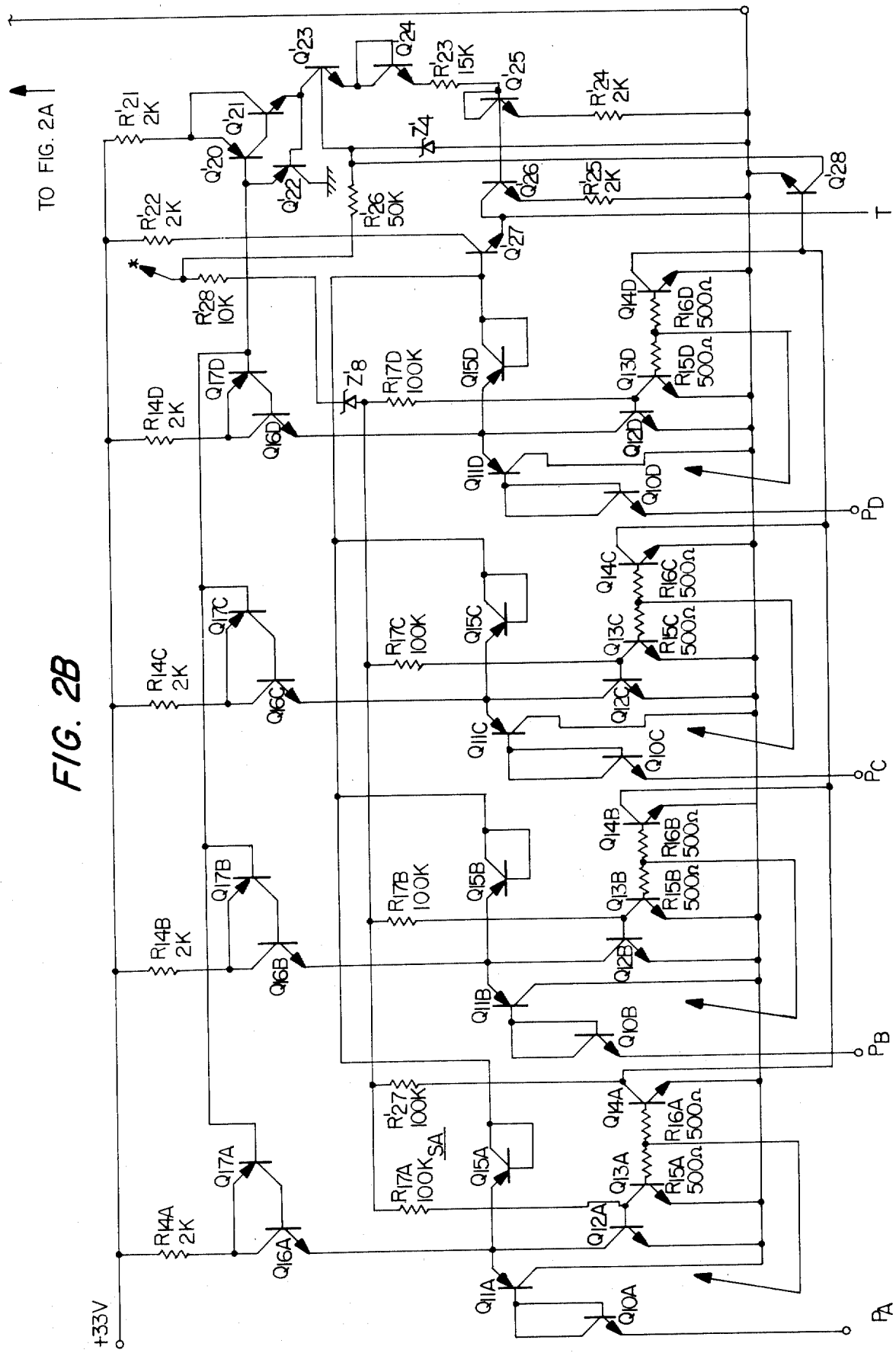
Figure 3:
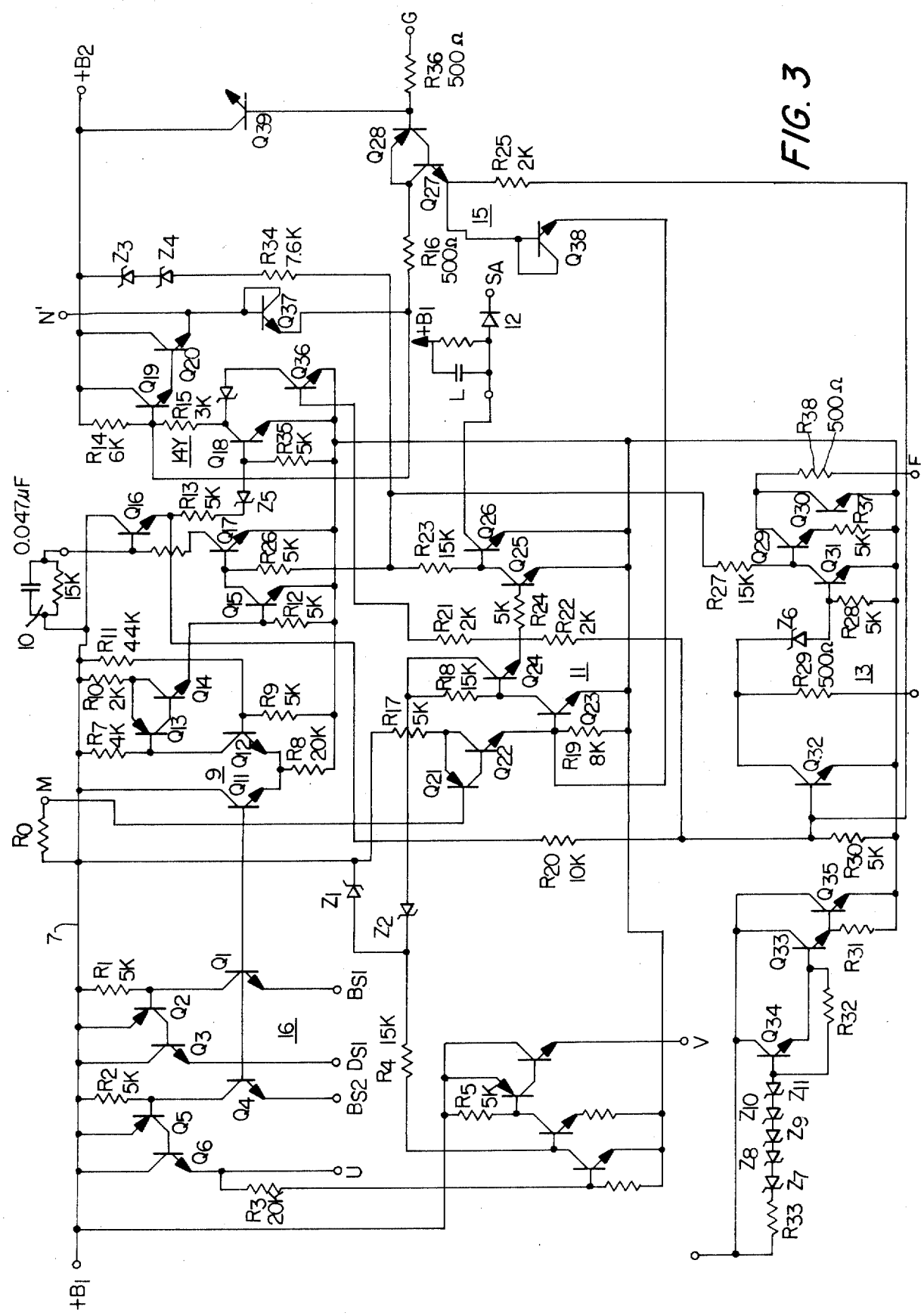
FIG. 3 is a schematic diagram of the control CTL.

FIG. 2 shows a schematic diagram of the individual tuning control voltage generators CHA, CHB, CHC and CHD and a portion of 14X of the control output 14 of the control CTL, and FIG. 3 is a schematic diagram of the control CTL, in which the remaining portion 14Y of the control output 14 is shown, while the portion 14X is shown in FIG. 2, as described previously. In the following the circuit configuration and operation of the individual tuning control voltage generators CHA, CHB, CHC and CHD and the control CTL will be described with reference to FIGS. 2 and 3. With particular reference to FIG. 2, the amplifier 1A is implemented by transistors Q1A, Q2A and Q3A and resistors concerned, the gate 2A is implemented by transistors Q5A and Q6A, the storing circuit 5A is implemented by transistors Q9A, Q8A and Q7A, a Zener diode Z1A and resistors concerned, the switch circuit 6A is implemented by a transistor Q13A and other transistors and resistors therearound, and the drive circuit 8A is implemented by a transistor Q4A. The other individual tuning control voltage generators CHB, CHC and CHD are similarly structured and the various corresponding components have been denoted similarly in accordance with the above mentioned convention in connection with the subscript of B, C and D.

With particular reference to FIG. 3, the band switch 16 is implemented by transistors Q1 through Q6 and the resistors concerned, the detecting circuit 9 is implemented by transistors Q11 and Q12 and the resistors concerned, the delay circuit 10 is implemented by a combination of parallel connected capacitor and resistor, the circuit 13 is implemented by transistors Q29 through Q32, a Zener diode Z6 and the resistors concerned, the initial setting circuit 11 is implemented by transistors Q21 through Q26 and the resistors concerned, and the auxiliary circuit 15 is implemented by transistors Q27, Q28 and Q38 and the resistors concerned. The portion 14X of the control output 14 is seen at the right upper portion of FIG. 2, while the remaining portion 14Y of the control output 14 is seen at the right upper portion of FIG. 3.

If and when a touch signal constituting an individual channel selecting signal generated through a touch of a finger to one of the touch buttons (not shown) provided on the front surface of a television receiver is applied to the terminal SA, the transistors Q1A, Q2A and Q3A implementing the amplifier 1A become conductive, whereby the transistor implementing the drive circuit 8A which has been off becomes also conductive. As a result only the transistor Q6A out of series connected transistors Q5A and Q6A implementing the gate 2A is biased in the forward direction. If and when the common line 3 is in the high level potential and the base of the transistor Q5A is supplied with the positive voltage, it follows that the two transistors Q5A and Q6A both become conductive to allow a current to flow through the path comprising resistors R8A and R7A. As a result, the forward bias is established in the transistor Q9A to make the said transistor Q9A to be conductive. Accordingly, the transistor Q8A is also turned on to allow a current to flow through the path of the common line 4 → the transistor Q8A → the Zener diode A → the resistors R11A and R12A, whereby the transistor Q7A is turned on to allow a current to flow through the path comprising the common line 4 → the resistor R8A → the resistor R13A → the transistor Q7A. As a result, even if the said touch signal is terminated and the gate 2A is closed at that time, the storing circuit implemented by a transistors Q9A, Q8A and Q7A, the Zener diode Z1A, and the resistors R11A, R12A and R13A are kept in the so called active state, specifically defined in the present specification. Accordingly, the terminal A is kept providing the positive voltage, unless the above described active state of the storing circuit is changed or reversed. The said positive voltage obtainable from the storing circuit 5A through the terminal A is applied to the switch circuit 6A and the switch circuit 6A is rendered in the conductive state. As a result, a predetermined voltage obtainable from the potentiometer 17A (not shown in FIG. 2) through the terminal PA is withdrawn through transistors Q10A, Q11A, Q15A and Q27' from the terminal T.

For the purpose of eliminating any adverse effect to the preset voltage as preset by the potentiometer 17A through a voltage drop caused by conduction between the base-emitter of these transistors Q10A, Q11A, Q15A and Q27a', the embodiment shown comprises a constant current source circuit implemented by transistors Q20' through Q26' at the side of the transistor Q27' and constant current source circuits for the respective voltage generators CHA, CHB, CHC and CHD implemented by Q16A, Q17A; Q16B, Q17B; Q16C, Q17C; and Q16D, Q17D, respectively. Assuming that the base of the transistor Q23' is in a given positive potential, the transistors 1Q20' through Q27' are turned on, thereby to allow a constant current $i$ to flow through the emitter of the transistor Q27'. Since the transistor Q27' is operative in an unsaturated manner, the base current thereof turns to be $i/hfe$, with the result that substantially the full amount of the current flowing through the constant current source circuit implemented by the transistors Q16A and Q17A, assuming the reception of A channel, is caused to flow through the transistor Q11A. Accordingly, the transistors Q27' and Q11A are operated with the emitter current $i$, and the diode connected transistors Q15A and Q10A connected to the base of these transistors Q27' and Q11A, respectively, are driven with the current of $i/hfe$. Since the transistors Q27' and Q11A and the transistors Q15A and Q10A have been so selected that the conductivity types of these transistors are opposite and connection thereof is so selected that the base-emitter voltage of each transistor may be dissolved, the preset voltage obtainable from the potentiometer 17A through the terminal PA is withdrawn from the output terminal T without any substantial voltage drop. As readity understood to those skilled in the art, any variation caused by temperature is also compensated in the above described circuit configuration.

If an integrated circuit of one chip is structured to comprise a plurality of individual voltage generators, as shown, an operative state of any one of the individual voltage generators causes a current to flow through all the constant current source transistors Q16A, Q17A; Q16B, Q17B; Q16C, Q17C; and Q16D, Q17D. However, if and when one of the four individual voltage generators of another integrated circuit, say IC-II, is in an operative state, it is not necessary that a constant current flows in the first integrated circuit IC-I now in discussion and rather it is preferred that such a constant current is adapted not to flow in the integrated circuit which is in a non-operative state. The reason is that although all the integrated circuit current is withdrawn from the same voltage source, a continuous flow of such a constant current through all the integrated circuits IC-I, IC-II, and IC-III increases an amount of the constant current flowing out of the voltage source, whereby the voltage of the voltage source is liable to fluctuate. Since the circuits of the embodiment shown has been so designed that the constant current circuit of the respective integrated circuit can be interrupted in case where none of the individual voltage generators within the integrated circuit is in an active state and a constant current circuit is made enabled only for the integrated circuit in which one of the individual voltage generators is in an active state for reception of the corresponding channel. As a result, the fluctuation in the source voltage is eliminated. This will be described in more detail with reference to the drawings.

As described previously, assuming that any one of the individual voltage generators, say the generator CHA corresponding to A channel, has been in an operative state, the transistor Q13A has been turned on, and the transistor Q14A is also rendered conductive, so that the collector potential thereof falls to the ground potential. Therefore, the transistor Q28' is turned off and the base of the transistor Q23' is kept in the high potential level, thereby to allow the constant current to flow, as described previously. At that time the transistor Q22' is shunted and accordingly the transistors Q16A, Q17A; Q16B, Q17B; Q16C, Q17C; and Q16D, Q17D are biased in the forward direction, whereby a current is allowed to flow through all of these transistors. However, assuming that none of the voltage generators in the integrated circuit has been in an operative state, the transistors Q14A, Q14B, Q14C and Q14D all are turned off, whereby the positive potential is applied to the base of the transistor Q28' through the path comprising the resistor R28' → the Zener diode Z8' → the resistor R27', and the transistor Q28' is shunted, whereby the base of the transistor Q23' becomes grounded and the transistor Q20' through Q27' are cut off, while turning off of the transistor Q22' removes the forward bias of the transistors Q16A, Q17A; Q16B, Q17B; Q16C, Q17C; and Q16D, Q17D, thereby not to allow a current to flow therethrough.

As described previously, the circuit of the embodiment shown has been so designed that a constant current is made to flow through only the integrated circuit in which an individual tuning control voltage generator is brought in an operative state.

Figure 4:
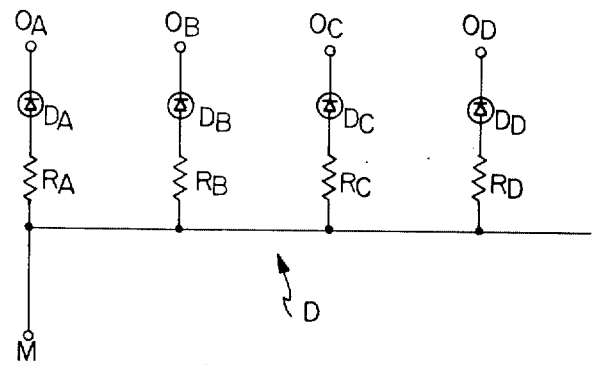
FIG. 4 is a schematic diagram showing a connection of the light emitting diodes in the voltage generators CHA, CHB, CHC and CHD.

The collector of the transistor Q4A constituting the drive circuit 8A provided between the amplifier 1A and the storing circuit 5A is connected to the terminal 0A, which is coupled to the terminal M of FIG. 3 through a light emitting diode DA and a resistor RA, as shown in FIG. 4. The terminal M is coupled through a resistor RO to a common bus 7 of the positive voltage source +B1, whereby conduction of the said transistor Q4A causes the light emitting diode DA to be lit to make display of the corresponding channel. Meanwhile, the base of the said transistor Q4A is also connected to the storing circuit 5A to receive the bias voltage, so that the transistor Q4A is maintained in the conduction state if and when the storing circuit 5A is in an active state.

Now the right upper portion 14X of the FIG. 2 circuit constituting a portion of the control output 14 will be described. The voltage VC at the terminal M is in the high level, if and when one channel is in the reception state, while the voltage VC falls at the time of channel switching. Considering a state in which A channel has been received, the voltage VC is in the high level and accordingly the Zener diodes Z2' and 23' are turned on, whereby the transistor Q19' is rendered conductive. Accordingly, the collector of the transistor Q19' falls to the ground potential and accordingly the transistors Q5A, Q5B, Q5C and Q5D constituting the respective gate 2A, 2B, 2C and 2D of the respective generators CHA, CHB, CHC and CHD and commonly connected to the common bus 3 and all rendered non-conductive. Thus all the gates 2A, 2B, 2C and 2D are positively closed, thereby to insure that malfunction in the channel selecting operation caused by noises received externally at the time of broadcasting reception does not occur. Since the channel VC falls at the time of channel switching, it becomes impossible for the Zener voltage off the diode Z2' and Z3' to be maintained, whereby the conduction bias comes not to be applied to the transistor Q19', with the result that the potential at the collector of the transistor Q19' and the common bus 3 connected thereto becomes the high level. Accordingly, the transistors Q5A, Q5B, Q5C and Q5D constituting in part the gates 2A, 2B, 2C and 2D of the generators CHA, CHB, CHC and CHD, respectively, become rendered conductive, when a touch signal is received and the gating signal is applied to the transistors Q6A, Q6B, Q6C and Q6D constituting in part the gates 2A, 2B, 2C and 2D, respectively.

The variation of the said voltage VC also controls the operation of the storing circuits. More specifically, if and when channel switching is effected from the state in which A channel has been received to the state in which B channel is received, the value of the voltage VC instantaneously falls and accordingly the potential of the common bus 4 connected to the emitter of the transistor Q18' also falls, thereby to disable the storing circuit 5A for A channel. The storing circuits 5B, 5C and 5D for other channels are also disabled and brough in an inactive state, when only the storing circuit 5B for B channel is enabled by a touch input signal, with the result that only the storing circuit 5B for B channel is brought and maintained in an active state with the recovery of the said voltage VC. Thus it is appreciated that the voltage VC makes simultaneous control of the gates and the storing circuit.

Now the fact that the value of the voltage VC falls at the time of channel switching will be described with reference to FIG. 3. Consider a case where channel switching is made from a state in which A channel has been received to a state in which B channel is received. When only A channel has been received, a current flows from the voltage source bus 7 through externally provided resistors RO and RA and the light emitting diode DA to the terminal OA, but in the instant of the channel switching to B channel a current flowing through the terminal OB is added to the above described current flowing through the resistors RO and RA and the light emitting diode DA with the result that the voltage drop across the resistor RO is increased and potential at the terminal M decreases considerably. Of the transistors Q11 and Q12 implementing the detecting circuit 9, only the transistor Q11 is rendered conductive when the current for only one channel flows through the said resistor RO, but only the transistor Q12 becomes conductive alternately in such a situation that the potential at the terminal M decreases, as previously described. If and when the transistor Q12 is turned off, the transistors Q13, Q14 and Q15 are also turned off, while the transistor Q17 is turned on and therefore the transistor Q16 and Q18 are turned off, whereby the base potential of the transistor Q19 is increased. Accordingly, the transistors Q19 and Q20 are biased hard and the emitter potential of the transistor Q20, i.e. the voltage VC obtainable at the terminal N becomes the value near the source voltage +B2. In such a state the voltage VC is in the high level.

On the other hand, when the channel is switched, the current flowing through the resistor RO is increased, and when the transistor R20 is turned on, the state of the said transistor Q20 is reversed. When the transistor Q18 is turned on, the base potential of the transistor Q19 is decreased, and the conduction bias of the transistors Q19 and Q20 becomes small, with the result that the value of the voltage VC decreases. The delay circuit 10 implemented by the externally provided resistor and the capacitor serves to delay the variation of the voltage thereat at the time of channel switching. Accordingly, the said transistor Q16 does not become conductive immediately after the transistor Q17 is turned off but the transistor Q16 is turned on if and when the base potential thereof is gradually increased as a function of the time constant determined by the resistor and the capacitor constituting the said delay circuit 10 and a predetermined voltage is reached. The said delay circuit 10 is provided for the purpose of determining the propriety of the individual channel selecting signal and specifically serves to make the transistor Q13 conductive only if and when a normal channel selecting signal of a full long time period is received.

Now, description will made of the initial setting circuit 11 for automatically establishing a reception state of a specified channel when a power switch of a receiver is turned on. Assuming that a current has been flowing through at least one tuning voltage generator and through the said resistor RO, i.e. when the power switch of the receiver has already been turned on and the receiver has been already energized, the transistors Q21, Q22 and Q23 are conductive and the transistors Q24 and Q25 are turned off and accordingly the transistor Q26 is turned on. Although the collector of the said transistor Q26 connected through the terminal L to the terminal SA, these two terminals are disconnected or interrupted by means of the diode 12 interposed therebetween in case where the transistor 26 is rendered conductive and the collector potential falls to the ground, thereby to reverse bias the diode 12. However, at the time when the power switch of the receiver is turned on and the receiver comes to be supplied with the power, there is no originally receiving channel and therefore the potential at the terminal M is in the high level, whereby the transistors Q21 and Q22 are reverse biased, with the result that the transistor Q26 is turned off. Accordingly, the collector of the transistor Q26 is brought to the positive potential and the base of the transistor Q6A of the gate 2A is supplied with the positive potential from the terminal SA. In order for the storing circuit 5A of A channel to be brough in an active state at the time of turning on of the power source of the receiver, it is necessary that in addition to application of the signal through the terminal SA, as described previously, the base of the transistor Q5A of the gate 2A is also brough to the high level. This requirement is met through operation of the initial setting circuit 11. More specifically, at the time of turning on of the power source of the receiver, the transistor Q24 of the initial setting circuit 11 is turned on, which makes the emitter of the transistor Q24 be the positive potential, which is applied through the resistor R21 to the base of the transistor Q36. Accordingly, the transistor Q36 is rendered conductive, thereby to decrease the base potential of the transistor Q19 of the circuit 14Y, with the result that the voltage VC decreases, as described previously. The decrease of the voltage VC makes the base potential of the transistor Q5A connected to the common bus B the high level, as described previously. As a result, the reception state of A channel is achieved as desired at the time of turning on of the power source of the receiver.

Another advantage achieved by the initial setting circuit 11 will be described in the following. Assuming that all the storing circuits are brough in an inactive state while the inventive apparatus has been energized, any one of the storing circuits is not brought in an active state in spite of reception of an individual channel selecting signal at the corresponding one of the input terminals SA, SB, SC and SD unless the voltage VC falls. According to the present invention, however, even if such a situation occurs in which none of the storing circuits is brough in an active state even after the power switch is turned on and the inventive apparatus is energized, the transistor Q24 is turned on and, as described previously in connection with the case of turning on of the power source, the decrease of the voltage VC is achieved and the drive signal is applied to the transistors Q5A, Q5B, Q5C and Q5D of the gates 2A, 2B, 2C and 2D. As a result, application of a touch channel selecting signal to any one of the input terminals SA, SB, SC and SD can achieve the reception state.

Now description will be made of the AFT malfunction preventing circuit 13. Since the AFT is operative even at the time of channel switching and this fact can cause undesirable malfunction of the AFT, it has been the common practice that the AFT is disabled at the time of channel switching. Since the transistor Q16 is turned on at the time of channel switching in the circuit shown, a current flows from the emitter thereof through the resistors R20 and R30, whereby the transistor Q32 of the circuit 13 is turned on. At the time of turning on of the power source as well, a current flows from the emitter of the transistor Q24 through the resistors R22 and R30 and similarly the transistor Q32 is turned on. Besides, even at the time of operation of the remote control, a current flows from the emitter of the transistor Q27 of the circuit 15 through the resistors R25 and R30 and the transistor Q32 is similarly turned on. If and when the transistor Q32 of the circuit 13 is rendered conductive, the transistor Q31 is turned off and the transistors Q29 and Q30 are turned on, with the result that the terminal F is brought to a potential near the ground potential. Since the terminal F is connected to the AFT signal supplying bus to the tuner TV, grounding of the said terminal F causes the AFT signal to be grounded, thereby to disable substantially the automatic fine tuning operation. As a result, the AFT is disabled at the time of turning on of the power switch of the receiver or at the time of channel switching in response to an individual channel selecting signal either by a touch signal or by a remote control signal.

The signal applied to the terminal G at the time of operation of the remote control is a negative going differentiated pulse, which makes the transistors Q28 and Q27 of the circuit 15 be conductive. At that time the base potential of the transistor Q19 of the circuit 14Y falls and accordingly the voltage VC also decreases, i.e. the voltage VC decreases even at the time of operation of the remote control as well as turning on of the power switch or channel switching. It is pointed out that at the time of remote control the voltage for disabling the initial setting circuit 11 is applied through the transistor Q38 of the circuit 15 to the transistor Q33 of the circuit 11.

In the foregoing, the so called sequential channel selection type remote control was described in which a remote control signal comprising a train of pulses the number of which is associated with channel selection is received. Alternatively, a remote control of an individual channel selection type may also be adopted in which selective application of a remote control signal direct to the corresponding one of the input terminals SA, SB, SC and SC achieves channel selection similar to the case of channel selection by a touch signal. In such a remote control of an individual channel selection type, the terminal G and devices of auxiliary circuit 15 for the remote control related to the terminal G, such as the transistors Q27, Q28 and Q38 and the resistors R16 and R25 and the like in FIG. 3 may be dispensed with, although these are indispensable in case where the remote control of a sequential channel selection type is adopted.

Figure 6:
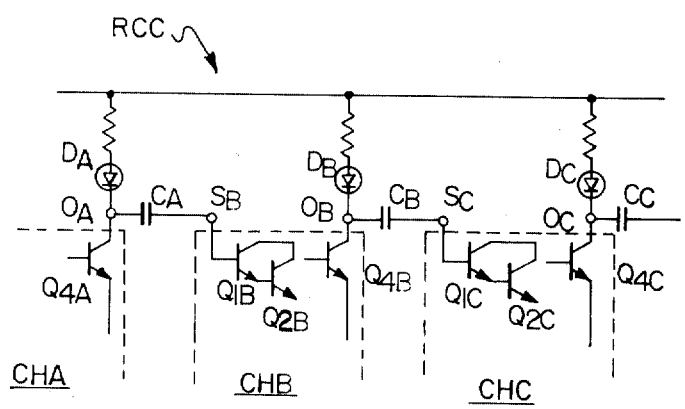
FIG. 6 is a schematic diagram showing an interconnection of the voltage generators for implementing a ring counter connection of the generators.

As described previously with reference to FIG. 1A, the ring counter connection RCC should be provided, in case where the remote control of a sequential channel selection type is adopted, for the purpose of implementing a ring counter connection with the multiple individual tuning control voltage generators. FIG. 6 shows a schematic diagram of the ring counter connection RCC with respect to only the voltage generators CHA, CHB and CHC, while the other portion was omitted for simplicity of illustration. Referring to FIG. 6, the ring counter connection RCC comprises capacitors CA, CB, CC. . . . interposed between the collectors of the transistors Q4A, Q4B, Q4C, Q4D . . . as at the output terminals OA, OB, OC . . . of the respective drive circuits 8A, 8B, 8C, . . . and the input terminals SB, SC, SD, . . . of the next adjacent voltage generators CHB, CHC, CHD, . . . . In operation, assuming that A channel has been selected, the transistor Q4A is turned on and accordingly the terminal OA is in a substantially grounded state. If and when the remote control signal of a train of shift pulse is applied to the terminal G in FIG. 3, the voltage VC decreases, as previously described, and the storing circuit 5A is brought in an inactive state. As a result, the potential at the terminal OA increases rapidly, whereby a positive pulse is applied to the input terminal SB of the next adjacent voltage generator CHB through the capacitor CA, but this pulse is maintained for a given period of time as a function of the charging time constant of the capacitor CA, during which period the voltage VC increases back to the original value, when the storing circuit 5B of the voltage generator CHB is brought in an active state. Thus, the active state of the storing circuits is sequentially shifted or transferred to the next adjacent voltage generators, in response to each of the incoming pulses received by way of the remote control signal. As a result, any desired channel corresponding to the number of pulses included in a remote control signal is selected.

Assuming that one channel has been selected as a result of selection of the channel by means of the sequential remote control, as described previously, a touch of a finger to a desired one of the touch buttons makes a touch signal be generated and the corresponding channel be switched. However, in some cases such a situation is not preferred. Therefore, a switch having one end grounded may be provided at the base side, e.g. the delay circuit side, of the transistor Q16, thereby to insure that the said switch is closed in advance at the time of selection of the channel by means of the remote control, so that the transistor Q16 may not be turned on.

Figure 5:
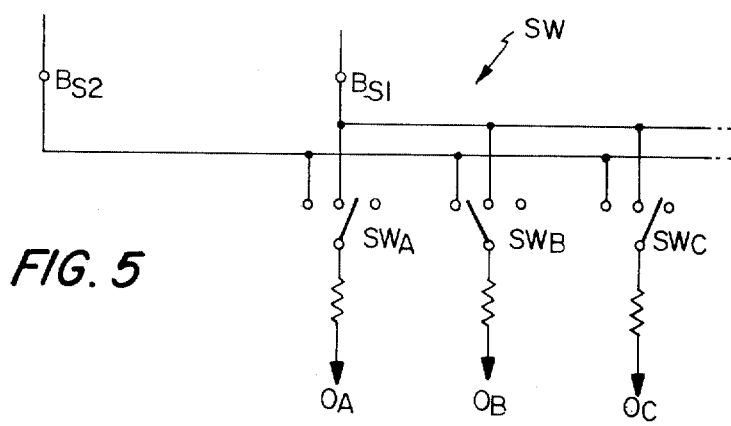
FIG. 5 is a schematic diagram showing a connection of preset switches SWA, SWB, SWC and SWD in the respective voltage generators CHA, CHB, CHC, and CHD.

Now description will be made of the band switching. The terminals BS1 and BS2 are coupled through the preset switches SWA, SWB, SWC, . . . to the output terminals OA, OB, OC, . . . , respectively, of the storing circuits 5A, 5B, 5C, . . . , respectively, as shown in FIG. 5. The band switching is achieved by presetting the said preset switches such that the said respective terminals are coupled to the BS1 side or coupled to the BS2 side or not coupled to either, with the result that a predetermined band is automatically attained in the turner TU when the said terminals OA, OB, OC, . . . are brought to an operative potential. Now assuming that in such a state that the terminal OA has been preset to the BS2 side, a drive signal is applied to the terminal OA in accordance with the active state of the storing circuit 5A of the voltage generator CHA the switching transistors Q4, Q5, Q6 and Q7 of the circuit 16 are turned on, and the terminal U is adapted to supply the source voltage for energizing the UHF tuner included in the tuner TU, whereby the tuner TU is rendered in a UHF reception state. Since the transistor Q7 is supplied with the forward bias at that time, the transistor Q7 is turned on and the transistors Q8, Q9, and Q10 are turned off, whereby the terminal V is not adapted to supply the source voltage to the VHF tuner included in the tuner TU.

If and when the terminal OA has been preset to the BS1 side, the transistors Q4, Q5 and Q6 are turned off and the transistors Q1, Q2 and Q3 are turned on in the circuit 16. Since the inductance coil switching diode (not shown) to be connected to the center tap of the coil connected in parallel with the voltage controlled variable capacitor in the tuner TU is connected to the terminal T1 at the emitter of the transistor Q3, the transistor Q3 is turned on and the positive voltage is applied to the terminal D1. As a result, the tuning circuit of the VHF tuner in the tuner TU is switched to a VHF high band reception state. At that time, the transistor Q7 is turned off and the transistors Q8, Q9 and Q10 are turned on, whereby the source voltage for energizing the VHF tuner is obtained at the terminal V. Thus, if and when the terminal OA is coupled to the BS1 side, the tuner TU is maintained in a state capable of receiving the high band of VHF. Assuming that the switch SWA has been preset such that the terminal OA is coupled to neither of the BSL and BS2 sides, no voltage necessary for coil switching is obtained at the said terminal D1, while the voltage is applied to the terminal V, with the result that the tuner TU is set to a state capable of receiving the low band of VHF.

Figure 7:
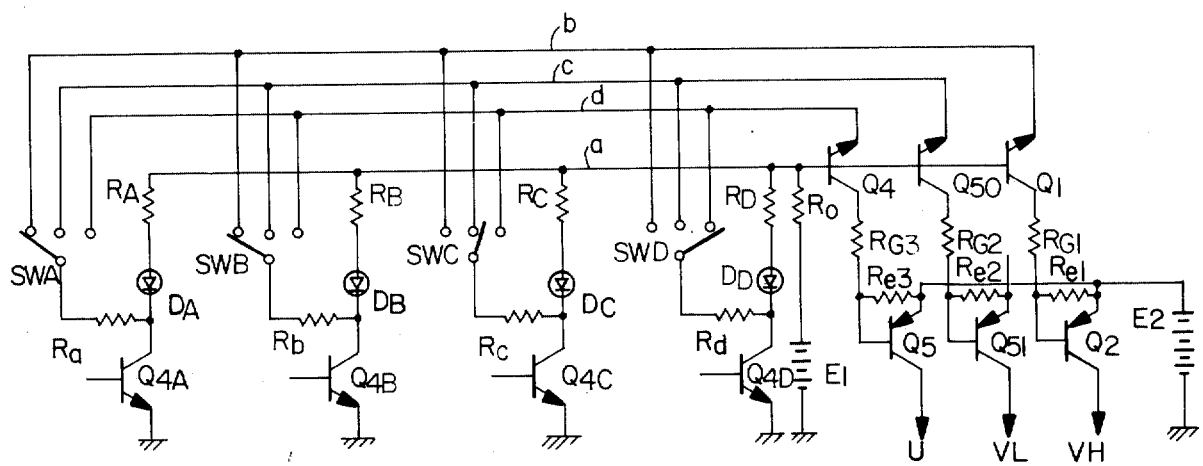
FIG. 7 is a schematic diagram of channel displays, preset switches for band switching and the band switch circuits selectively gathered from a portion of FIG. 2, and FIGS. 3, 4, and 5 for facility of description and understanding of the circuits concerned.

FIG. 7 is a schematic diagram of channel displays, preset switches for band switching and the band switch circuits selectively gathered from a portion of FIG. 2, and FIGS. 3, 4 and 5, for facility of description and understanding of the circuits connected. In comparison of the FIG. 7 circuit configuration with a combination of FIGS. 2, 3, 4 and 5, the FIG. 7 circuit additionally comprises transistors Q1, Q50 and Q4. The base electrodes of these transistors are connected together to a common bus a of the light emitting diodes DA, DB, DC and DD, the emitter electrodes of these transistors are each connected to the corresponding one of the band selecting busses b, c, and d, respectively, so as to provide at the corresponding collector electrodes, respectively, a predetermined voltage necessary for band setting. The preset switches SWA, SWB, SWC and SWD are connected to select only one of the busses b, c and d and resistors Ra, Rb, Rc and Rd are connected between the preset switches SWA SW, SWC and SWD and the light emitting diodes DA, DB, DC and DD. In operation, assuming that A channel has been selected and the transistor Q4A has been turned on, the light emitting diode DA is energized through the resistors RO and RA and the transistor Q4A to be lit, thereby to display the corresponding channel being selected. The transistor Q2 is caused to allow the base current to flow through the resistor Ra, the preset switch SWA, the transistor Q1 and the resistor Rb1, whereby the transistor Q2 is rendered conductive to provide a predetermined voltage VH to the tuner TU to select the high band of VHF. At that time the emitter of the transistor Q1 is in the potential lower than that in the common bus a of the light emitting diodes by the value commensurate with the forward voltage of the base-emitter junction of the transistor Q1. In general, the forward rising voltage of the light emitting diodes DA, DB, DC and DD is approximately 2V which is high enough, as compared with the forward voltage of the base-emitter junction of the transistors, to insure that a current does not flow through the resistor RB to the light emitting diode DB in the circuit CHB and the light emitting diode DB may not be lit. On the other hand, the emitter of the transistor Q50 connected to the preset switch SWC of the circuit CHC does not fall, the forward voltage of the base-emitter junction of the transistor Q50 more than the potential at the common bus a connected to the base of the transistor Q50. Accordingly, no reverse voltage is applied to the light emitting diode DC. As a result, the value of the resistors RA, RB, RC and RD and RO may be easily determined. The voltage of the voltage source E1 may be selected to meet only the relation with the voltage of the voltage source E2 such that at least the transistors Q1, Q50 and Q4 can fully operate. In general, the voltage of the voltage source E1 necessary for energizing the light emitting diodes may be lower as compared with the voltage of the voltage source E2. Therefore, selection of the voltage of the voltage source E1 is substantially free.

The present invention provides an electronic channel selecting apparatus performing various kinds of functions and having a structure easy of implementation in an integrated circuit with these various kinds of functions coordinated in a preferred manner, resulting in a simplified circuit configuration and economy in manufacture. For example, the input to the control output 14 for providing the gating signal and the disabling signal to the gates and the storing circuits, respectively, is adapted to be obtained commonly from the drive circuits, while the outputs from the drive circuits are adapted to be used for channel display and prevention of AFT malfunction and further for band switching and the like.

In practicing the present invention, several individual tuning control voltage generators may be incorporated in a single chip of an integrated circuit and a plurality of such chips may be disposed as necessary. As a result, the number of chips may be advantageously and properly selected, such as three chips for television receivers for the Japanese market and two chips for receivers for a different territory market, and the like. In addition each chip can be individually and selectively energized or deenergized, depending on whether any one of the individual tuning control voltage generators is rendered in an operative state or not in the chip, whereby the source voltage can be stabilized. Although the embodiment of the present invention was described in the foregoing as comprising bipolar transistors, the present invention is not limited thereto and the inventive apparatus may also be implemented using field effect transistors such as MOS transistors. However, the inventive apparatus comprising an integrated circuit implemented by bipolar transistors is more advantageous due to lower cost as compared with that implemented by MOS transistors.

Although this invention has been described and illustrated in detail, it is to be clearly understood that the same is by way of illustration and example only and is not to be taken by way of limitation, the spirit and scope of this inention being limited only by the terms of the appended claims.

What is claimed is:

1. An electronic channel selecting apparatus, comprising:

means for selectively providing a plurality of individual channel selecting signals for selecting the corresponding one of a plurality of broadcasting channels, tuning means comprising tuning circuit means including a voltage controlled variable reactance device the reactance of which is variable as a function of a tuning control voltage applied thereto, said variable reactance device determining a tuning frequency of said tuning means, a plurality of tuning control voltage providing means, each responsive to the corresponding one of said individual channel selecting signals for providing a different tuning control voltage to said voltage controlled variable reactance device of said tuning means for selecting the corresponding one of said plurality of broadcasting channels, each said tuning control voltage providing means comprising gate means responsive to a gating signal for allowing the corresponding individual channel selecting signal to pass therethrough, store means responsive to said corresponding individual channel selecting signal, as gated by said gate means, for assuming an active state and responsive to a disabling signal for assuming an inactive state, preset voltage providing means for providing a predetermined voltage for selecting the corresponding one of said plurality of broadcasting channels when said predetermined voltage is applied to said variable reactance device, and switching means responsive to the active state output from said store means for allowing said predetermined voltage to pass therethrough to said voltage controlled variable reactance device of said tuning means, said apparatus further comprising means responsive to any one of said plurality of store means being in an active state and an individual channel selecting signal being received in any one of said plurality of tuning control voltage providing means for providing said gating and disabling signals to said gate means and store means, respectively for causing said one store means to assume an inactive state and for causing the store means of said one tuning control voltage providing means to assume an active state, whereby the broadcasting channel corresponding to said one tuning control voltage providing means is selected.

2. An electronic channel selecting apparatus in accordance with claim 1, in which said gating and diabling signal providing means comprises delay means for delaying the individual channel selecting signal for determining propriety of said individual channel selecting signal.

3. An electronic channel selecting apparatus in accordance with claim 1, which further comprises means responsive to the outputs from store means of said plurality of tuning control voltage providing means for displaying the corresponding receiving channel.

4. An electronic channel selecting apparatus in accordance with claim 1, in which said tuning means is a type being capable of being switched to a plurality of channel bands, and which further comprises means responsive to the outputs from said store means of said plurality of tuning control voltage providing means for switching to the corresponding band to which the corresponding receiving channel pertains.

5. An electronic channel selecting apparatus in accordance with claim 1, in which said individul channel selecting signal providing means comprises a touch switch for individually providing said plurality of individual channel selecting signals in response to a touch of a human body thereto.

6. An electronic channel selecting apparatus in accordance with claim 1, in which said gating/disabling signal providing means comprises means for evaluating the sum of the output currents from said plurality of tuning control voltage providing means, and means responsive to said sum of the output currents for determining at least two said store means being in an active state for providing said gating and disabling signals.

7. An electronic channel selecting apparatus in accordance with claim 6, in which said current sum evaluating means comprises resistor means connected such that the output currents from said plurality of store means may flow commonly therethrough, and said determining means comprises means for threshold detecting the voltage across said resistor means.

8. An electronic channel selecting apparatus in accordance with claim 1, in which said tuning means is a type being capable of being switched to a plurality of channel bands, and which further comprises means responsive to the outputs from the store means of said plurality of tuning control voltage providing means for displaying the corresponding receiving channel, and means responsive to the outputs from the store means of said plurality of tuning control voltage providing means for switching to the corresponding band to which the corresponding receiving channel pertains.

9. An electronic channel selecting apparatus in accordance with claim 8, in which said display means comprises switching devices each responsive to the output from the corresponding store means of the corresponding tuning control voltage providing means for being on/off controllable, and display devices each connected to be controllable by the corresponding switching device, and said band switching means comprises a common bus commonly connected to said display devices of said plurality of tuning control voltage providing means, a plurality of band switching transistors, having first electrodes connected to said common bus, second electrodes selectively connectd to a predetermined one of a plurality of said band switch selecting busses and further having third electrodes, a plurality of presetting switches connected between the said band switch selecting busses and said switching devices of the respective tuning control voltage providing means, and means for supplying from said third electrodes of said transistors a set of band switching signals to said tuning means.

10. An electronic channel switching apparatus in accordance with claim 1, in which said individual channel selecting signal providing means comprises interconnection means for implementing interconnection of said plurality of tuning control voltage providing means in a ring counter fashion, and means for stepping said active state of said store means through said interconnection means.

11. An electronic channel selecting apparatus in accordance with claim 10, in which said individual channel selecting signal providing means further comprises a touch switch for individually providing said plurality of individual channel selecting signals in response to a touch of a human body thereto.

12. An electronic channel selecting apparatus in accordance with claim 10, in which said interconnection means comprises means for connecting the output from the store means of one tuning control voltage providing means to an input of said individual channel selecting signal of the next adjacent tuning control voltage providing means.

13. An electronic channel selecting apparatus in accordance with claim 12, in which said interconnection means comprises capacitor means.

14. An electronic channel selecting apparatus in accordance with claim 1, in which said switch means of each said plurality of tuning control voltage providing means comprises means for providing a constant current for allowing transfer of said predetermined voltage from said preset voltage supplying means to said voltage controlled variable reactance device for minimizing the voltage drop across said switch means.

15. An electronic channel selecting apparatus in accordance with claim 14, which further comprises means for disabling the tuning control voltage providing means the store means of which is in an inactive state.

16. An electronic channel selecting apparatus in accordance with claim 15, in which said plurality of tuning control voltage providing means are divided into at least two groups, and said disabling means comprises means for disabling the tuning control voltage providing means of the group all store means of which are in an inactive state.

* * * * *